(12) United States Patent
Religieux et al.

(10) Patent No.: US 10,011,914 B2
(45) Date of Patent: Jul. 3, 2018

(54) COPPER ELECTRODEPOSITION BATH CONTAINING AN ELECTROCHEMICALLY INERT CATION

(71) Applicant: ALCHIMER, Massy (FR)

(72) Inventors: Laurianne Religieux, Chatenay Malabry (FR); Paul Blondeau, Paris (FR); Dominique Suhr, Antony (FR)

(73) Assignee: ALCHIMER, Massy (FR)

( * ) Notice: Subject to any disclaimer, the term of this patent is extended or adjusted under 35 U.S.C. 154(b) by 0 days.

(21) Appl. No.: 14/482,617

(22) Filed: Sep. 10, 2014

(65) Prior Publication Data

US 2015/0159291 A1 Jun. 11, 2015

Related U.S. Application Data

(60) Provisional application No. 61/913,634, filed on Dec. 9, 2013.

(51) Int. Cl.
| | | |
|---|---|---|
| *C25D 3/38* | (2006.01) | |
| *C25D 7/12* | (2006.01) | |
| *H01L 21/288* | (2006.01) | |
| *H01L 21/768* | (2006.01) | |

(52) U.S. Cl.
CPC ............... *C25D 7/123* (2013.01); *C25D 3/38* (2013.01); *H01L 21/2885* (2013.01); *H01L 21/76877* (2013.01); *H01L 21/76843* (2013.01); *H01L 21/76873* (2013.01)

(58) Field of Classification Search
CPC .......... C25D 3/38; C25D 7/123; H01L 21/00; H05K 3/00
See application file for complete search history.

(56) References Cited

U.S. PATENT DOCUMENTS

| | | | | |
|---|---|---|---|---|
| 3,754,940 | A * | 8/1973 | Kadison et al. | 106/1.26 |
| 4,294,670 | A * | 10/1981 | Raymond | C25D 17/10 205/131 |
| 5,454,930 | A * | 10/1995 | Miura | C25D 3/38 205/125 |
| 8,147,600 | B2 * | 4/2012 | Mayer et al. | 96/174 |
| 8,147,660 | B1 * | 4/2012 | Mayer | C25D 17/10 204/230.2 |
| 2001/0047943 | A1 * | 12/2001 | Barstad et al. | 205/123 |
| 2002/0027081 | A1 * | 3/2002 | Nagai | C25D 3/38 205/157 |
| 2004/0152303 | A1 * | 8/2004 | Verbunt | 438/678 |
| 2004/0265501 | A1 * | 12/2004 | Choi | C23C 18/1632 427/443.1 |

(Continued)

FOREIGN PATENT DOCUMENTS

| | | |
|---|---|---|
| FR | 2890983 | 3/2007 |
| WO | WO 2007/034116 | 3/2007 |
| WO | WO 2007/096390 | 8/2007 |

*Primary Examiner* — Stefanie S Wittenberg
(74) *Attorney, Agent, or Firm* — Hamre, Schumann, Mueller & Larson, P.C.

(57) ABSTRACT

The present invention relates to an electrolyte composition for depositing copper on metal substrates. The composition contains a combination of two aromatic amines and an electrochemically inert cation. This electrolyte makes it possible to increase the copper nucleation density. It also allows bottom-up filling in trenches that have a very small opening dimension, typically lower than 40 nm.

10 Claims, 1 Drawing Sheet

(56) References Cited

U.S. PATENT DOCUMENTS

| | | | |
|---|---|---|---|
| 2006/0243599 A1* | 11/2006 | Shih | C25D 3/38 |
| | | | 205/261 |
| 2007/0062818 A1 | 3/2007 | Daviot et al. | |
| 2009/0183993 A1 | 7/2009 | Daviot et al. | |
| 2010/0294539 A1* | 11/2010 | Sasaki et al. | 174/126.4 |
| 2011/0284386 A1 | 11/2011 | Willey et al. | |

* cited by examiner

COPPER ELECTRODEPOSITION BATH CONTAINING AN ELECTROCHEMICALLY INERT CATION

The present invention relates to a copper electrodeposition bath that be used to electroplate copper on a variety of substrates, preferably on metal substrates. The invention also relates to a method of electrodeposition of copper for fabricating interconnects in integrated circuits.

PRIOR ART

Interconnects form a network of lines of electrically conducting copper for connecting various components. Fabricating interconnects involves first etching trenches in a dielectric material, and second filling the trenches with copper. Copper filling can be achieved by an electrochemical or a non-electrochemical method.

For durable functioning of the integrated circuit, a layer that forms a barrier to copper diffusion must be interposed between the dielectric material and the copper lines. However, the resistance of the materials with barrier properties is too high to allow filling of the trenches with copper in a uniform way. According to known methods, it is therefore necessary, prior to the electrochemical copper filling step, to cover the barrier layer with a thin layer of metallic copper, called copper seed layer, so that the conductivity of the substrate to be coated is increased. There are essentially two methods of depositing a copper seed layer: physical vapor deposition (PVD) and electrochemical deposition.

The vapor phase processes are directional methods so that the deposited copper does not have a constant thickness on the entire surface of the trench to be covered. A surplus of material is generally deposited at the entrance of the trenches and the copper seed layer shows discontinuity on the sidewall of the trenches, so that voids are created in the copper deposit during the filling step in the middle and at the bottom of the trenches.

Techniques for electrodeposition of copper seed layers on barrier materials have had to be developed, as the baths used for filling the structures with copper did not allow deposition in thin, regular layers directly on the barrier material.

Moreover, miniaturization of devices such as high-power computer chips with high storage density and low dissipation requires a decrease in size of the trenches, and the thickness of the seed layer decreases with the width of the trench. For example, if the trench has a width of 20 nm, the thickness of the seed layer cannot exceed 5 nm. Existing methods do not allow the continuous deposition of seed layers having such a small thickness. Below a certain threshold, a seed layer that is very fine, continuous and at the same time conformal, cannot be obtained with the electrolytes of the prior art.

It was found that the electrolytes used for filling with copper do not work when the trenches have a high form factor, typically greater than 3/1 (note that the form factor corresponds to the ratio of the depth of the pattern to the width of its opening at the surface of the substrate). In particular, it is observed, at the end of the filling step that voids may form in the copper deposited in such trenches, which tends to increase the resistance or even cause a break in the copper conducting line. The voids may be located between the substrate and the copper deposit, or in the copper deposit itself, generally in the form of a void line equidistant from the edges of the trench or in the form of holes.

The applicant has filed several patent applications relating to compositions for electrodeposition of copper for producing seed layers on barrier layers.

Electrodeposition compositions are known from document WO 2007/034116 that make it possible to deposit copper seed layers that are adherent, conformal and uniform on resistive barriers. The formulations described in that document are designed for making ultrathin deposits, usually with a thickness of less than 20 nm, on substrates having resistivities of the order of some tens of ohms/square. It was found that such electrolytes cannot be used for completely filling the trenches with copper: "voids" or void lines ("seams") in fact appear in the copper deposit with this type of bath.

Electrodeposition compositions are also known, from document WO 2007/096390, that make it possible to fill—in just one step on the copper barrier—lines and holes (also called vias) for interconnection with copper. The interconnection vias must not be confused with through-silicon vias (TSV), whose dimensions are much larger.

The formulations described in document WO 2007/096390 are designed specifically for solving the problem of filling interconnection lines and holes. However, it was found that the compositions illustrated cannot be used for filling trenches of small size.

For filling interconnection structures of increasing fineness, the requirements are i) to have electrolytes that allow conformal deposition of very fine copper seed layers on barrier substrates, ii) to have electrolytes that allow defect-free filling of the trenches, and iii) to have electrolytes that make the prior deposition of a seed layer unnecessary, and allow the trenches to be filled without the prior formation of a seed layer.

The inventors discovered that adding certain electrochemically inert cations to a copper electrolyte containing aromatic amines makes it possible to improve the nucleation of copper on the most resistive materials that are a barrier to the diffusion of copper such as ruthenium or cobalt. The inventors also discovered that these cations generate, in combination with these amines, a suppressant effect specific to the deposition of copper.

GENERAL DESCRIPTION OF THE INVENTION

Thus, according to one of its aspects, the present invention relates to an electrolyte for electrodeposition of copper on a substrate, said electrolyte comprising, in aqueous solution, copper ions and a promoter of nucleation of metallic copper on said substrate, characterized in that the promoter of nucleation of copper is a combination of at least two aromatic amines and an electrochemically inert cation selected from the group consisting of cesium ($Cs^{2+}$), alkylammonium and mixtures thereof.

The alkylammoniums may be compounds of formula $(N-R_1R_2R_3R_4)^+$ in which $R_1$, $R_2$, $R_3$ and $R_4$ represent, independently of one another, a hydrogen or a $C_1$-$C_4$ alkyl, provided that $R_1$, $R_2$, $R_3$ and $R_4$ do not simultaneously represent hydrogen, and mixtures thereof.

According to a second aspect, the present invention relates to an electrochemical process for depositing copper on patterns hollowed-out in a dielectric substrate covered with a material that is a barrier to the diffusion of copper, the patterns having an opening width or diameter less than 40 nm, the process being characterized in that it comprises the steps of:

bringing the surface of the trenches into contact with an electrolyte as described above, polarizing the surface of the barrier layer to an anodic or cathodic electric potential allowing the electrodeposition of copper on the barrier layer, for a time sufficient to form a continuous deposit of copper on said barrier layer.

It has been demonstrated that the electrolyte of the invention makes it possible to fill without material defects, very fine trenches or small vias having high form factors.

Definitions

"Electrodeposition" means in the present text a method that makes it possible to cover a surface of a substrate with a metallic or organometallic coating, in which the substrate is polarized electrically and brought into contact with a liquid containing precursors of said metallic or organometallic coating (called electrolyte), so as to form said coating. Electrodeposition is performed for example by passing a current between the substrate to be coated constituting one electrode (cathode in the case of a metallic coating) and a second electrode (the anode) in a bath containing a source of precursors of the coating material (for example metal ions in the case of a metallic coating) and optionally various agents intended to improve the properties of the coating formed (evenness and fineness of the deposit, resistivity, etc.), optionally in the presence of a reference electrode. By international convention the current and voltage applied to the substrate of interest, i.e. to the cathode of the electrochemical circuit, are negative. Throughout this text, when these currents and voltages are mentioned with a positive value, it is implicit that this value represents the absolute value of said current or of said voltage.

"Electrolyte" means the liquid containing precursors of a metallic coating used in an electrodeposition process as defined above.

"Suppressor" means a substance that will be adsorbed on the surface of the barrier layer or on the surface of copper that will have been deposited on the barrier layer at the start and during the electrodeposition process, which has the function of partially masking the surface to be coated so as to slow the reaction taking place at this surface.

"Accelerator" means a substance for accelerating the growth of copper at the bottom of the trench. The accelerator acts on modification of the mechanisms of reduction of copper, which has the effect of increasing the kinetics of deposition of the metal.

"Electrochemically inert cation" means a cation that does not undergo any reaction of reduction or of oxidation during passage of a current in an electrodeposition process as defined above.

"Promoter of nucleation of copper" means an improvement in the density and a decrease in the size of the first crystal seeds, also called nuclei, which will be at the origin of the material formed and its microstructural properties.

"Opening dimension" of patterns such as vias or trenches, means the average diameter or average width of the patterns hollowed-out beforehand in the dielectric. These dimensions are measured at the surface of the dielectric material.

"Continuous deposit" means either a mass of void-free copper reflecting optimal filling of a pattern from bottom to top ("bottom-up"), or a conformal deposit of small thickness not filling the volume of the pattern. In the prior art, holes or material voids may be observed in a copper deposit between the walls of the patterns and the copper deposit ("sidewall voids"). Voids equidistant from the walls of the patterns in the form of holes or lines ("seams") may also be observed. These voids may be observed by electron microscopy and quantified by preparing transverse sections of the deposits. The continuous deposit of the invention preferably has an average percentage of voids below 10 vol %, preferably less than or equal to 5 vol %. The number of voids may be measured by transmission electronic microscopy (TEM). A conformal deposit may have a conformity level above 80%, preferably greater than or equal to 90%, more preferably greater than or equal to 95%, or even above 99%. The conformity may be calculated from observations of sections with the scanning electron microscope, by comparing the thickness of the seed layer at different points, all of the points selected preferably being located in the pattern and not on the surface. We may for example measure the difference between the smallest thickness and the largest thickness of the deposit, within the pattern.

DETAILED DESCRIPTION OF THE INVENTION

The present invention relates to an electrolyte for electrodeposition of copper on a substrate, said electrolyte comprising, in aqueous solution, copper ions and a promoter of nucleation of metallic copper on said substrate, characterized in that the promoter of nucleation of copper comprises or consists of the combination of at least two aromatic amines and an electrochemically inert cation selected from the group consisting of cesium ($Cs^{2+}$), alkylammonium and mixtures thereof.

The substrate to be electroplated is preferably a metal that is chosen in the group consisting of copper, tantalum, titanium, cobalt and ruthenium.

In general, the electrodeposition composition according to the invention comprises a source of cupric ions $Cu^{2+}$ (copper II) in the form of a salt. Advantageously, the source of copper ions used for preparing the electrolyte is a copper(II) salt such as copper sulfate, copper chloride, copper nitrate, copper acetate, preferably copper sulfate, and more preferably copper sulfate pentahydrate.

According to a particular feature, the source of copper ions is present in the electrodeposition composition at a concentration between 0.4 and 40 mM, for example between 1 and 25 mM, and more preferably between 2 and 6 mM.

The term "between . . . and . . . " used in the present application, excludes the cut-off values, whereas the term "from . . . to . . . " includes the recited lower and upper limits.

The alkylammoniums are for example compounds of formula $(N-R_1R_2R_3R_4)^+$ in which $R_1$, $R_2$, $R_3$ and $R_4$ represent, independently of one another, a hydrogen or a $C_1$-$C_4$ alkyl, provided that $R_1$, $R_2$, $R_3$ and $R_4$ do not simultaneously represent hydrogen. The $NH_4^+$ ion is not part of the invention.

A $C_1$-$C_4$ alkyl is for example methyl, ethyl, n-propyl or n-butyl. The alkylammoniums are preferably tetra-alkylammoniums, for example tetra-methylammonium, tetra-ethylammonium, tetra-propylammonium or tetra-butylammonium, methyltriethylammonium and ethyltrimethylammonium.

The cations are supplied in the form of salts, for example a sulfate salt. The counter-ion of the cation in the salt is preferably the same counter-ion than the counter-ion of the copper(II) salt.

The two aromatic amines may be selected from the group consisting of the bipyridines, 1,2-diaminobenzene, 3,5-dimethylaniline, pyridine, 8-hydroxyquinoline sulfonate, 3,5-dimethylpyridine, 2,2'-bipyrimidine, 2-mercaptothiazoline, 2-methylamino-pyridine and imidazole. The two aromatic amines advantageously do not have a —COOH group.

The sum of the concentrations of the aromatic amines is preferably between 1.6 and 160 mM, preferably between 4 and 100 mM, for example between 4 and 24 mM. In a particular embodiment, the two aromatic amines are 2,2'-bipyridine and imidazole.

When one of the two amines is a bipyridine, preferably a 2,2'-bipyridine, the concentration of bipyridine is preferably between 0.4 and 40 mM, preferably between 1 and 25 mM, for example between 2 and 6 mM.

The bipyridine preferably represents from 0.5 to 2, more preferably from 0.75 to 1.25 molar equivalents, more preferably of the order of 1 molar equivalent of the concentration of copper ions.

When one of the two amines is imidazole, the concentration of imidazole is preferably between 1.2 and 120 mM, preferably between 1.5 and 75 mM, for example between 2 and 18 mM.

Imidazole preferably represents from 1 to 5, more preferably from 1 to 4 molar equivalents. More preferably, imidazole is about 1 molar equivalent of the concentration of copper ions.

The electrolyte of the invention may contain thiodiglycolic acid as an accelerator of the electrodeposition of copper, at a concentration between 1 and 500 mg/l, preferably between 2 and 100 mg/l.

The electrolyte may further comprise a complexing agent of copper(II) known by a person skilled in the art, preferably an amine. The electrolyte may be devoid of pyridine and of a carboxylic acid different from thiodiglycolic acid.

The electrolyte is used by applying an electric current. It is not indicated in an electroless process, and for this reason does not contain a reducing agent of copper oxide, such as dimethylamine borane or hypophosphorous acid.

Although there is in principle no restriction about the solvent (provided that it sufficiently solubilizes the active species of the solution and does not interfere with electrodeposition), water will be preferred. According to one embodiment, the solvent comprises predominantly water by volume.

The mixture of the two amines and of the electrochemically inert cation may perform the function of suppressor specific to copper. Moreover, the electrolyte of the invention may advantageously be devoid of polymeric suppressors such as polyethylene glycols. In the prior art, a source of chlorine ions is generally added to the electrolyte to act in synergy with a polymeric suppressor. In the context of the present invention, it was discovered that it is not necessary to add chlorine ions to guarantee the efficacy of the solution. Moreover, the electrolyte of the invention comprises less than 50 ppm of chlorine ions. The electrolyte of the invention is preferably free from chlorine ions.

Surfactants are generally required in the prior art for improving the wettability of the surface of a barrier material to be coated with copper. According to the invention, it is not necessary to incorporate surfactants in the electrolyte.

The electrolyte may comprise a leveler and/or a brightener known from the prior art, for example a polypyridine.

The pH of the electrolyte is preferably selected to be above 6.7. This is all the more surprising as the electrolytes of the prior art used for filling cavities generally have a far lower pH to guarantee sufficient conductivity of the solution owing to the presence of $H^+$ ions, and in consequence, to obtain adequate kinetics. The pH of the electrolyte of the invention is preferably above 6.7, more preferably above 6.8, more preferably between 8 and 13, for example between 8 and 10, and even more preferably of the order of 9 to 9.5.

The pH of the composition may optionally be adjusted with a base or an acid known by a person skilled in the art after mixing the aromatic amines with the copper II ions and the electrochemically inert cation.

The pH of the composition, once adjusted, may optionally be stabilized in the aforementioned pH range by means of a buffer such as one of those described in: "Handbook of chemistry and physics—84th Edition" David R. Lide, CRC Press. We may mention for example the hydrogen carbonate salts, for example potassium hydrogen carbonate.

The electrolyte of the invention is preferably free from copper complexing agents such as aliphatic amines and organic acids. These copper complexing agents are for example EDTA, citric acid, polycarboxylic acids, aliphatic amines (such as ethylenediamine) and glyoxylic acid. The electrolyte of the invention is preferably free from a polycarboxylic acid other than thiodiglycolic acid.

According to a particular embodiment, the concentration of the copper ions is between 0.4 and 40 mM, the concentration of bipyridine is between 0.4 and 40 mM, the concentration of imidazole is between 1.2 and 120 mM, the concentration of electrochemically inert cation is between 0.4 and 100 mM. For example, the concentration of copper ions is between 2 and 6 mM, the sum of the concentrations of the aromatic amines is between 4 and 24 mM, and the concentration of the cation is between 2 and 20 mM.

The invention also relates to an electrochemical process for depositing copper on the surface of patterns that have been hollowed-out in a dielectric substrate, the patterns having an opening dimension less than 40 nm and the process being characterized in that it comprises the steps of:
bringing the surface of the patterns into contact with an electrolyte described above,
polarizing the surface of the patterns to an anodic or cathodic electric potential allowing the electrodeposition of copper, so as to form a continuous deposit of copper.

All the features that have been described in relation to the first aspect of the invention apply to the electrodeposition process.

In the method of the invention, the dielectric substrate may be covered with a layer forming a barrier to diffusion of copper, and optionally with a copper seed layer, which have both been deposited by a method known by a person skilled in the art.

When the substrate is covered with a layer forming a barrier to diffusion of copper, the method of the invention may comprise the step of 1) depositing a copper seed layer on the barrier layer, or the step of 2) completely filling said trench with said deposit of copper.

When the substrate is covered successively with a layer forming a barrier to diffusion of copper, and a copper seed layer, the method of the invention may consist of completely filling said trench with said deposit of copper.

In a first embodiment, the method of the invention is a method of depositing a copper seed layer on the surface of patterns. According to this method, the dielectric substrate is covered with a layer forming a barrier to diffusion of copper, and the continuous deposit of copper is a conformal seed layer with a thickness under 10 nm that comes into contact with the barrier material, and that covers it at least partially.

In a second embodiment, the method of the invention is a method of filling patterns. According to this method:
the dielectric substrate is covered with a layer forming a barrier to diffusion of copper, itself covered at least partially with a copper seed layer, and the continuous deposit of copper comes into contact with the seed layer and fills the entire volume of the patterns.

In a third embodiment, the method of the invention is a method of filling patterns. According to this method:
the dielectric substrate is covered with a layer forming a barrier to diffusion of copper, and
the continuous deposit of copper comes into contact with the barrier layer and fills the entire volume of the patterns.

In these embodiments, the seed layer deposited preferably has a thickness—measured in the patterns—between 0.5 and 10 nm, for example between 2 and 5 nm.

The method of the invention makes it possible to deposit copper in patterns with small opening dimension, notably trenches of very small width. Thus, the opening dimension of the patterns may be below an upper limit selected from the group consisting of 40 nm, 35 nm, 30 nm and 25 nm. The patterns preferably have an opening dimension greater than or equal to 5 nm.

The form factor—expressed as the ratio depth/opening dimension of the patterns—may vary from 2:1 to 20:1, for example from 3:1 to 10:1. The method according to the invention advantageously allows the deposition of copper uniformly in cavities having particularly high form factors, for example greater than 2:1, greater than 3:1, greater than 4:1, greater than 5:1, greater than 6:1, or even greater than 7:1 and above.

The layer forming a diffusion barrier to copper may comprise at least one material selected from cobalt (Co), ruthenium (Ru), tantalum (Ta), titanium (Ti), tantalum nitride (TaN), titanium nitride (TiN), tungsten (W), tungsten titanate (TiW), tungsten nitride or carbide (WCN), manganese (Mn) and manganese nitride ($Mn_3N_2$). The thickness of the barrier layer is generally between 0.5 and 10 nm.

The layer forming the barrier to diffusion of copper may comprise a stack of several layers of different materials, including a layer of a material forming a barrier to diffusion of copper and a layer of a material promoting adhesion of copper ("liner"). According to a first embodiment example, the dielectric substrate used is covered successively—at least in the patterns—with 1) a layer of tantalum nitride with a thickness between 0.5 and 3 nm, 2) a layer of cobalt with a thickness between 0.5 and 3 nm, and 3) a layer of copper with a thickness between 0.5 and 5 nm.

According to a second embodiment example, the dielectric substrate used is covered successively—at least in the patterns—with 1) a layer of tantalum nitride with a thickness between 0.5 and 3 nm, and 2) a layer of ruthenium with a thickness between 0.5 and 5 nm.

During the deposition step, the surface of the cavity to be filled may be polarized, either in constant-current mode (fixed imposed current), or in constant-voltage mode (potential imposed and fixed, optionally relative to a reference electrode), or else in pulsed mode (in current or in voltage).

According to one embodiment of the invention, polarization of the surface of the cavity of the pattern is carried out in continuous mode, imposing a current per unit area in a range from 0.1 $mA/cm^2$ to 50 $mA/cm^2$, preferably from 0.5 $mA/cm^2$ to 5 $mA/cm^2$, and preferably between from 0.5 to 1.5 $mA/cm^2$.

According to another embodiment of the invention, polarization of the surface of the cavity of the pattern is carried out in current-pulsed or voltage-pulsed mode at medium or high frequency.

The polarization of the surface may be carried out for example in current-pulsed mode by imposing an alternation of periods of polarization and periods of rest without polarization. The frequency of the periods of polarization may be between 0.1 kHz and 50 kHz (i.e. a duration of polarization between 0.02 ms and 10 ms), preferably between 1 kHz and 20 kHz, for example between 5 kHz and 15 kHz, whereas the frequency of the periods of rest may be between 0.1 kHz and 50 kHz, preferably between 1 kHz and 10 kHz, for example 5 kHz. The surface may be polarized by applying a current with maximum intensity between 0.01 and 10 $mA/cm^2$, for example about 0.4 to 5 $mA/cm^2$.

The time for filling the patterns smaller than 40 nm is advantageously between 10 s and 10 minutes depending on the size of the patterns, preferably between 15 s and 5 minutes. In one embodiment, the duration of the electrodeposition step is under 2 minutes to obtain complete filling of trenches with an opening dimension under 40 nm and depth greater than 50 nm.

The electrolytes according to the invention may be used following a procedure comprising an initial step of "hot entry", but particularly advantageously, they may also be used following a procedure comprising an initial step of "cold entry", during which the surface to be coated is brought into contact with the electrodeposition bath without electrical polarization, and maintained in this state for the desired time. Thus, according to a particular feature, the method according to the invention comprises, prior to electrodeposition, a step of "cold entry" during which the surface of the cavity to be filled is brought into contact with the electrodeposition composition according to the invention without electrical polarization, and optionally maintained in this state for at least 30 seconds.

The electrodeposition process according to the invention may be carried out at a temperature between 20 and 30° C., i.e. at room temperature. Therefore it is not necessary to heat the electrodeposition bath.

The method according to the invention allowed filling with copper to be performed with excellent quality, without material defects.

This method may be used for filling a cavity in which the surface of the barrier layer is covered at least partially with a copper seed layer.

Advantageously, the method according to the invention may also be used for filling a cavity whose surface comprises at least one material forming a diffusion barrier to copper, and is not covered with a copper seed layer.

The invention finally relates to the semiconductor devices obtainable by the method that has just been described.

The invention is illustrated in more detail with the following figures and examples.

EXAMPLE 1, COMPARATIVE: ELECTROLYTE WITHOUT THE CATION OF THE INVENTION

Figure 1:
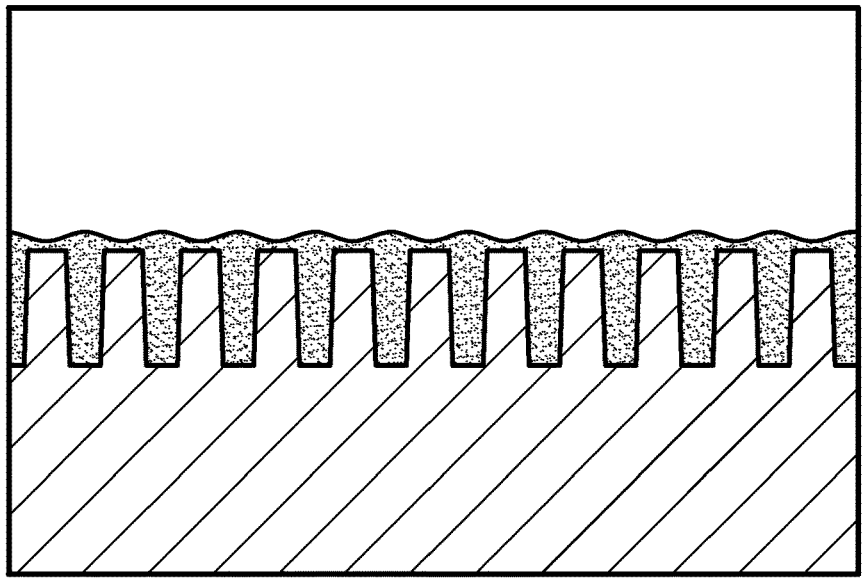
FIG. 1 shows the copper filling of trenches 25 nm wide and 75 nm deep with an electrodeposition solution of the invention.

Trenches 25 nm wide and 75 nm deep were filled with copper directly on a ruthenium barrier layer using a composition containing 2,2'-bipyridine and imidazole, without an electrochemically inert cation.

A. Material and Equipment

Substrate:

The substrate used in this example consisted of a piece of silicon with a length of 4 cm and a width of 4 cm, covered with a structured silicon oxide layer having trenches 25 nm wide and 75 nm deep and itself coated with a layer of ruthenium (Ru) less than 4 nm thick deposited by atomic layer deposition. The resistivity of the layer of ruthenium was 250 ohm/square.

This layer of ruthenium constitutes a diffusion barrier to copper such as is used in so-called "damascene" structures in the fabrication of copper interconnects of integrated circuits. The trenches are produced by a method called "double patterning".

Electrodeposition Solution:

In this solution, the concentration of 2,2'-bipyridine was 4.55 mM and the concentration of imidazole was 4.55 mM. The concentration of $CuSO_4(H_2O)_5$ was equal to 1.3 g/l, which is equivalent to 4.55 mM. The concentration of thiodiglycolic acid could vary from 5 to 200 ppm, for example could be equal to 25 ppm. The pH of the solution was equal to 6.8.

Equipment:

In this example, electrolytic deposition equipment was used, made up of two parts: the cell intended to contain the electrodeposition solution, equipped with a system for recirculation of fluid for controlling the hydrodynamics of the system, and a rotating electrode equipped with a sample holder suitable for the size of the pieces used (4 cm×4 cm). The electrolytic deposition cell had two electrodes:

a copper anode the piece of structured silicon coated with the layer of ruthenium, which constitutes the cathode.

Connectors provided electrical contact of the electrodes, which were connected by electrical leads to a potentiostat supplying up to 20 V or 2 A.

B. Experimental Protocol

The cathode was polarized in current-pulsed mode in a range of current from 3 mA (or 0.33 mA/cm$^2$) to 15 mA (or 1.67 mA/cm$^2$), for example 11.4 mA (or 1.27 mA/cm$^2$) with a pulse frequency between 1 and 10 kHz in cathodic polarization, and between 0.5 and 5 kHz in zero polarization between two cathodic pulses.

The duration of the electrodeposition step was 14 minutes and 49 seconds to obtain complete filling of the trenches, 25 nm wide and 75 nm deep.

C. Results Obtained

The presence of holes in the walls of the trenches ("sidewall voids") was observed and quantified at a level of 40% (40% of the trenches have a sidewall void) by TEM, by preparing transverse sections.

Figure 2:
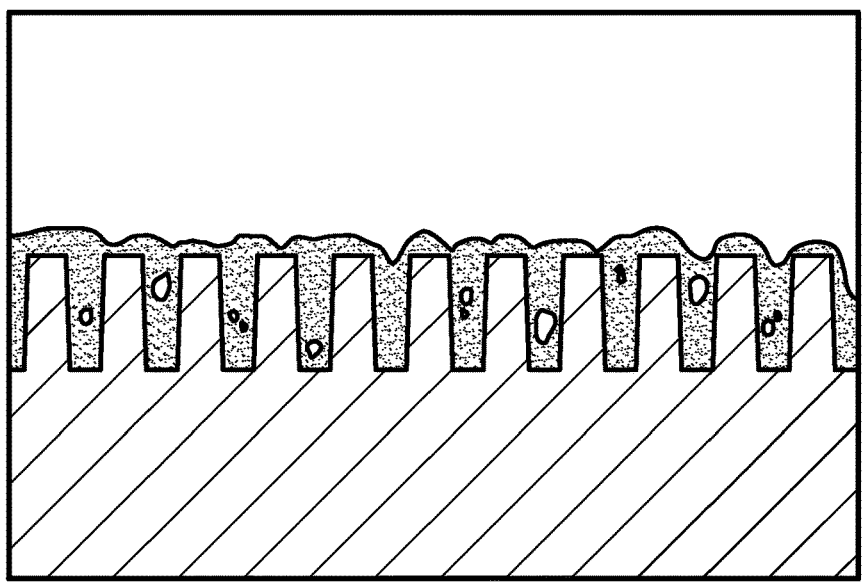
FIG. 2 shows the copper filling of trenches 25 nm wide and 75 nm deep with an electrolyte not containing an electrochemically inert cation. Void lines and void holes are observed in the trenches.

Holes or veins of holes were also observed in the filling, demonstrating a lack of growth of the copper from the bottom of the trenches upwards and the absence of bottom-up effect (see FIG. 2).

EXAMPLE 2

Trenches 25 nm wide and 75 nm deep were filled with copper directly on a ruthenium barrier layer using a composition according to the invention, based on 2,2'-bipyridine, imidazole and cesium sulfate.

A. Material and Equipment

Substrate:

The substrate used in this example was identical to that in example 1.

Electrodeposition Solution:

In this solution, the concentration of 2,2'-bipyridine was 2.28 mM and the concentration of imidazole was 2.28 mM. The concentration of $CuSO_4(H_2O)_5$ was equal to 0.65 g/l, which is equivalent to 2.28 mM. The concentration of thiodiglycolic acid could vary from 5 to 200 ppm, for example could be equal to 10 ppm. The concentration of cesium sulfate could vary from 1 g/l to 5 g/l, for example could be equal to 3 g/l (8.29 mM). The pH of the solution was 6.8.

Equipment:

The equipment used in this example was identical to that in example 1.

B. Experimental Protocol

The cathode was polarized in current-pulsed mode in a range of current from 5 mA (or 0.63 mA/cm$^2$) to 15 mA (or 1.88 mA/cm$^2$), for example 7.5 mA (or 0.94 mA/cm$^2$) with a pulse frequency of 10 kHz for the cathodic pulse and 5 kHz for the rest periods between two cathodic pulses.

The duration of the electrodeposition step was 1 min to obtain complete filling of the trenches, 25 nm wide and 75 nm deep.

C. Results Obtained

The filled trenches do not have holes on the walls of the trenches ("sidewall voids"), reflecting better nucleation of the copper on the barrier layer in the presence of cesium sulphate (see FIG. 1).

EXAMPLE 3

Trenches 25 nm wide and 75 nm deep were filled with copper directly on a ruthenium barrier layer using a composition according to the invention, based on 2,2'-bipyridine, imidazole and tetramethylammonium sulfate.

A. Material and Equipment

Substrate:

The substrate used in this example was identical to that in example 1.

Electrodeposition Solution:

In this solution, the concentration of 2,2'-bipyridine was 4.55 mM and the concentration of imidazole was 4.55 mM. The concentration of $CuSO_4(H_2O)_5$ was equal to 1.3 g/l, which is equivalent to 4.55 mM. The concentration of thiodiglycolic acid could vary from 5 to 200 ppm, for example could be equal to 10 ppm. The concentration of tetramethylammonium sulfate could vary from 1 g/l to 5 g/l, for example could be equal to 3.45 g/l (14 mM). The pH of the solution was between 6.7 and 7.2.

Equipment:

The equipment used in this example was identical to that in example 1.

B. Experimental Protocol

The cathode was polarized in current-pulsed mode in a range of current from 5 mA (or 0.63 mA/cm$^2$) to 15 mA (or 1.88 mA/cm$^2$), for example 7.5 mA (or 0.94 mA/cm$^2$) with a pulse frequency of 10 kHz for the cathodic pulse and 5 kHz for the rest periods between two cathodic pulses.

The duration of this step was generally between 15 s and 2 minutes in order to obtain complete filling of the trenches.

In this example, the duration of the electrodeposition step was 1 min to obtain complete filling of the trenches, 25 nm wide and 75 nm deep.

C. Results Obtained

The trenches do not have holes on the walls of the trenches ("sidewall voids"), reflecting better nucleation of the copper on the barrier layer in the presence of tetramethylammonium sulfate.

EXAMPLE 4, COMPARATIVE: ELECTROLYTE WITH A CATION THAT IS DIFFERENT FROM THE CATION OF THE INVENTION

Trenches 25 nm wide and 75 nm deep were filled with copper directly on a ruthenium barrier layer using a composition containing 2,2'-bipyridine, imidazole and potassium sulfate.

A. Material and Equipment

Substrate:

The substrate used in this example was identical to that in example 1.

Electrodeposition Solution:

In this solution, the concentration of 2,2'-bipyridine was 4.55 mM and the concentration of imidazole was 4.55 mM. The concentration of $CuSO_4(H_2O)_5$ was equal to 1.3 g/l, which is equivalent to 4.55 mM. The concentration of thiodiglycolic acid could vary from 5 to 200 ppm, for example could be equal to 10 ppm. The concentration of potassium sulfate could vary from 1 g/l to 5 g/l, for example could be equal to 1.27 g/l (7.22 mM). The pH of the solution was between 6.7 and 7.2.

Equipment:

The equipment used in this example was identical to that in example 1.

B. Experimental Protocol

The cathode was polarized in current-pulsed mode in a range of current from 5 mA (or 0.63 mA/cm$^2$) to 15 mA (or 1.88 mA/cm$^2$), for example 7.5 mA (or 0.94 mA/cm$^2$) with a pulse frequency of 10 kHz for the cathodic pulse and 5 kHz for the rest periods between two cathodic pulses.

The duration of the electrodeposition step was 1 min to obtain complete filling of the trenches, 25 nm wide and 75 nm deep.

C. Results Obtained

The presence of holes on the walls of the trenches ("sidewall voids") was observed.

Holes or veins of holes are also observed in the filling, demonstrating a lack of growth of copper from the bottom of the trenches upwards (absence of bottom-up effect).

EXAMPLE 5, COMPARATIVE: ELECTROLYTE WITH A CATION THAT IS DIFFERENT FROM THE CATION OF THE INVENTION

Trenches 25 nm wide and 75 nm deep were filled with copper directly on a ruthenium barrier layer using a composition containing 2,2'-bipyridine, imidazole and ammonium sulfate.

A. Material and Equipment

Substrate:

The substrate used in this example was identical to that in example 1.

Electrodeposition Solution:

The electrodeposition solution used in this example was an aqueous solution containing $CuSO_4(H_2O)_5$, 2,2'-bipyridine, imidazole, thiodiglycolic acid and ammonium sulfate.

In this solution, the concentration of 2,2'-bipyridine was 4.55 mM and the concentration of imidazole was 4.55 mM. The concentration of $CuSO_4(H_2O)_5$ was equal to 1.3 g/l, which is equivalent to 4.55 mM. The concentration of thiodiglycolic acid could vary from 5 to 200 ppm, for example could be equal to 10 ppm. The concentration of ammonium sulfate could vary from 0.5 g/l to 5 g/l, for example could be equal to 0.99 g/l (6.9 mM). The pH of the solution was between 6.7 and 7.2.

Equipment:

The equipment used in this example was identical to that in example 1.

B. Experimental Protocol

The cathode was polarized in current-pulsed mode in a range of current from 5 mA (or 0.63 mA/cm$^2$) to 15 mA (or 1.88 mA/cm$^2$), for example 7.5 mA (or 0.94 mA/cm$^2$) with a pulse frequency of 10 kHz for the cathodic pulse and 5 kHz for the rest periods between two cathodic pulses.

The duration of this step was generally between 15 s and 2 minutes in order to obtain complete filling of the trenches.

In this example, the duration of the electrodeposition step was 1 min to obtain complete filling of the trenches, 25 nm wide and 75 nm deep.

C. Results Obtained

The presence of holes on the walls of the trenches ("sidewall voids") was observed.

Holes or veins of holes are also observed in the filling, demonstrating a lack of growth of copper from the bottom of the trenches upwards (absence of bottom-up effect).

EXAMPLE 6

A copper seed layer was deposited in trenches 25 nm wide and 75 nm deep directly on a stack of layers, constituting a barrier, ending with ruthenium. The electrolyte composition according to the invention was based on 2,2'-bipyridine, imidazole and cesium sulfate.

A. Material and Equipment

Substrate:

The substrate used in this example was identical to that in example 1.

Electrodeposition Solution:

In this solution, the concentration of 2,2'-bipyridine was 2.28 mM and the concentration of imidazole was 2.28 mM. The concentration of $CuSO_4(H_2O)_5$ was equal to 0.65 g/l, which is equivalent to 2.28 mM. The concentration of cesium sulfate could vary from 1 g/l to 5 g/l, for example could be equal to 3 g/l (8.29 mM). The pH of the solution was 6.8.

Equipment:

The equipment used in this example was identical to that in example 1.

B. Experimental Protocol

The cathode was polarized in current-pulsed mode in a range of current from 5 mA (or 0.63 mA/cm$^2$) to 15 mA (or 1.88 mA/cm$^2$), for example 7.5 mA (or 0.94 mA/cm$^2$) with a pulse frequency of 10 kHz for the cathodic pulse and 5 kHz for the rest periods between two cathodic pulses.

The duration of the electrodeposition step was 15 seconds to obtain a copper seed layer of 5 nm in trenches 25 nm wide and 75 nm deep.

C. Results Obtained

The copper seed layer deposited is continuous and conformal (same thickness inside and outside the patterns).

The invention claimed is:

1. An electrochemical process for depositing copper on patterns hollowed-out in a dielectric substrate, the patterns having an opening dimension less than 40 nm and comprising a layer forming a barrier to diffusion of copper, the process comprising the steps of:

bringing a surface of the layer forming a barrier to diffusion of copper into contact with an electrolyte comprising, in aqueous solution, copper ions, a combination of at least two aromatic amines comprising bipyridine and imidazole, and an electrochemically inert cation selected from the group consisting of cesium ($Cs^{2+}$), alkylammonium of formula (N—R1R2R3R4)+ in which R1, R2, R3 and R4 represent, independently of one another, a hydrogen or a C1-C4 alkyl, provided that R1, R2, R3 and R4 do not simultaneously represent a hydrogen and mixtures thereof, wherein the concentration of copper ions is between 0.4 and 40 mM, wherein the concentration of the electrochemically inert cation is between 0.4 and 100 mM, and wherein the bipyridine represents from 0.75 to 1.25 molar equivalent of the concentration of copper ions, and wherein imidazole represents from 1 to 5 molar equivalent of the concentration of copper ions, and polarizing the surface of the patterns to an anodic or cathodic electric potential allowing the electrodeposition of copper, so as to form a deposit of copper that fills the entire volume of the patterns, comes into contact with the layer forming a barrier to diffusion of copper and has an average percentage of voids below 10 vol. %.

2. The electrochemical process as claimed in claim 1, wherein the layer forming the barrier to diffusion of copper comprises at least one material selected from the group consisting of cobalt (Co), ruthenium (Ru), tantalum (Ta), titanium (Ti), tantalum nitride (TaN), titanium nitride (TiN), tungsten (W), tungsten titanate (TiW) and tungsten nitride or carbide (WCN), manganese (Mn) and manganese nitride ($Mn_3N_2$).

3. The electrochemical process as claimed in claim 1, wherein the patterns are trenches or interconnection vias.

4. The electrochemical process as claimed in claim 1, wherein the dielectric substrate is covered successively, at least in the patterns, with a layer of tantalum nitride with a thickness between 0.5 and 3 nm, and a layer of ruthenium with a thickness between 0.5 and 5 nm.

5. The electrochemical process as claimed in claim 1, wherein the form factor is from 2:1 to 20:1.

6. The electrochemical process as claimed in claim 1, wherein the copper ions are derived from a copper salt and wherein the electrochemically inert cation is supplied in the form of a salt having the same counter ion as said copper salt.

7. The electrochemical process as claimed in claim 1, wherein the copper ions are derived from copper sulphate, and wherein alkylammonium cations are supplied in the form of alkylammonium sulphate.

8. The electrochemical process as claimed in claim 1, wherein the concentration of copper ions is between 2 and 6 mM, and the concentration of the electrochemically inert cation is between 2 and 20 mM.

9. The electrochemical process as claimed in claim 1, wherein the electrolyte contains hydrogen carbonate ions ($HCO3^-$).

10. The electrochemical process as claimed in claim 1, wherein the electrolyte has a pH of between 6.7 and 9.5.

* * * * *